United States Patent [19]

Maschek et al.

[11] Patent Number: 4,725,838

[45] Date of Patent: Feb. 16, 1988

[54] METHOD FOR PROCESSING ANALOG OUTPUT SIGNALS FROM CURRENT AND VOLTAGE TRANSDUCERS AND FACILITY FOR CARRYING OUT THE METHOD

[75] Inventors: Martin Maschek, Würenlos; Georg Mastner, Niederrohrdorf, both of Switzerland

[73] Assignee: BBC Brown, Boveri & Company, Limited, Baden, Switzerland

[21] Appl. No.: 715,467

[22] Filed: Mar. 25, 1985

[30] Foreign Application Priority Data

Mar. 26, 1984 [CH] Switzerland ............ 1507/84

[51] Int. Cl.$^4$ .............................................. G08C 19/16
[52] U.S. Cl. .................................. 340/870.19; 370/96
[58] Field of Search ....................... 340/870.19, 870.24, 340/870.29; 370/96, 113, 91, 81, 41; 328/151

[56] References Cited

U.S. PATENT DOCUMENTS

| 4,196,417 | 4/1980 | Fasching et al. | 340/870.24 |
| 4,296,412 | 10/1981 | Mastner | 340/870.29 |
| 4,563,588 | 1/1986 | Tanaka | 328/151 |
| 4,595,921 | 6/1986 | Wang et al. | 370/96 |
| 4,603,418 | 7/1986 | Townsend | 370/96 |

FOREIGN PATENT DOCUMENTS

| 63402 | 10/1982 | European Pat. Off. |
| 3015234 | 10/1981 | Fed. Rep. of Germany |
| 58-28665 | 2/1983 | Japan |

OTHER PUBLICATIONS

Soceany, "Uberwachung und Steuerung des Elektrischen Energieverbrauchs Mittels ProzeBrechner," *Regelungstechnische Praxis*, vol. 20, No. 6 (Jun. 1978).

Electric Current Transducer for EHV Circuits, Electric Power Research Institute, U.S.A., 1980.

Optical Fiber Communication System, Publication GP-10566, Meidensha Electric Mfg. Co., Ltd., Tokyo.

*Primary Examiner*—John W. Caldwell, Sr.
*Assistant Examiner*—Tyrone Queen
*Attorney, Agent, or Firm*—Burns, Doane, Swecker & Mathis

[57] ABSTRACT

Analog output signals from decentralized transducers for current and voltage are sampled with timing patterns generated at a decentralized location and are transmitted to a central evaluating facility in the form of digitally encoded data streams ($D_{UR}, \ldots$).

For the purpose of generating data sets which are each based on one sampling of each analog output signal, such that the relative time displacement of the samplings should not exceed a predetermined value which corresponds to the maximum ($\Delta$) of the data-refresh intervals, latch commands (L) are generated at greater intervals in the central evaluating facility, following which in each case the digitized sampled value arriving next of each data stream ($D_{UR}, \ldots$) is temporarily stored. After the temporary storage has taken place, in each case a "Ready" signal ($B_{UR}, \ldots$) is set. The "Ready" signals ($B_{UR}, \ldots$) are combined in a logical AND operation to form a "Data set ready" signal (DB) which is transferred to a computer which interrogates the temporarily stored data ($Z_{UR}, \ldots$) via a databus.

8 Claims, 2 Drawing Figures

METHOD FOR PROCESSING ANALOG OUTPUT SIGNALS FROM CURRENT AND VOLTAGE TRANSDUCERS AND FACILITY FOR CARRYING OUT THE METHOD

BACKGROUND OF THE INVENTION

The invention relates to a method for processing analog output signals from decentralized current and voltage transducers in a central evaluating facility and to a facility for carrying out the method.

A method for processing analog signals from decentralized current and voltage transducers is known (Electric Current Transducer for EHV Circuits; Electric Power Research Institute, U.S.A. 1980), in which the data transmitted from a single current transducer in a digitally coded form to an evaluating facility are directly reconverted into an analog signal.

A method is also known (Optical Fiber Communication System, Publication GP-10566 of the Meidensha Electric Mfg. Co. Ltd., Tokyo), in which data jointly to be processed further are synchronized by sampling commands transmitted by the central evaluating facility to the decentralized transducers. Such synchronization is elaborate, expensive and considerably complicates the system.

OBJECTS AND SUMMARY OF THE INVENTION

It is the object of the invention to specify a generic method in which the data transmitted from several decentralized transducers in a digitally coded form to a central evaluating facility are prepared in such a way that they can be jointly digitally processed further in the central evaluating facility, in which the phase shift between data to be jointly processed further, that is to say the time interval between the sampling times, which form the basis for the digitized sampled values originating from various transducers and to be jointly processed further, should not exceed a maximum value which is prescribed, for example, by standards.

In addition, it is intended to specify a facility for carrying out the method according to the invention.

The advantages achieved by the invention can be realized by the fact that the analog output signals of several transducers can be prepared in such a manner that a joint digital further processing is possible in which the relative phase shift of the signals present in digital coding must not exceed a predetermined value. For example, this makes it possible to determine in a simple manner the power which is transmitted over a line and which results from a multiplying operation on simultaneous voltage and current values and in the calculation of which only small relative phase errors are permissible.

Since no central control or synchronization of decentralized units is required and the transmission of data needs to take place in each case only in one direction, this being from the decentralised transducer to the central evaluating facility, the facilitiy needed for carrying to the method according to the invention can be implemented in a relatively simple and cost-effective manner. It can be easily designed in such a manner that it can be easily adapted to given conditions and requirements and, in particular, can be expanded without problems.

The invention is hereinafter explained in greater detail with the aid of drawings which represent a preferred embodiment.

Figure 1:
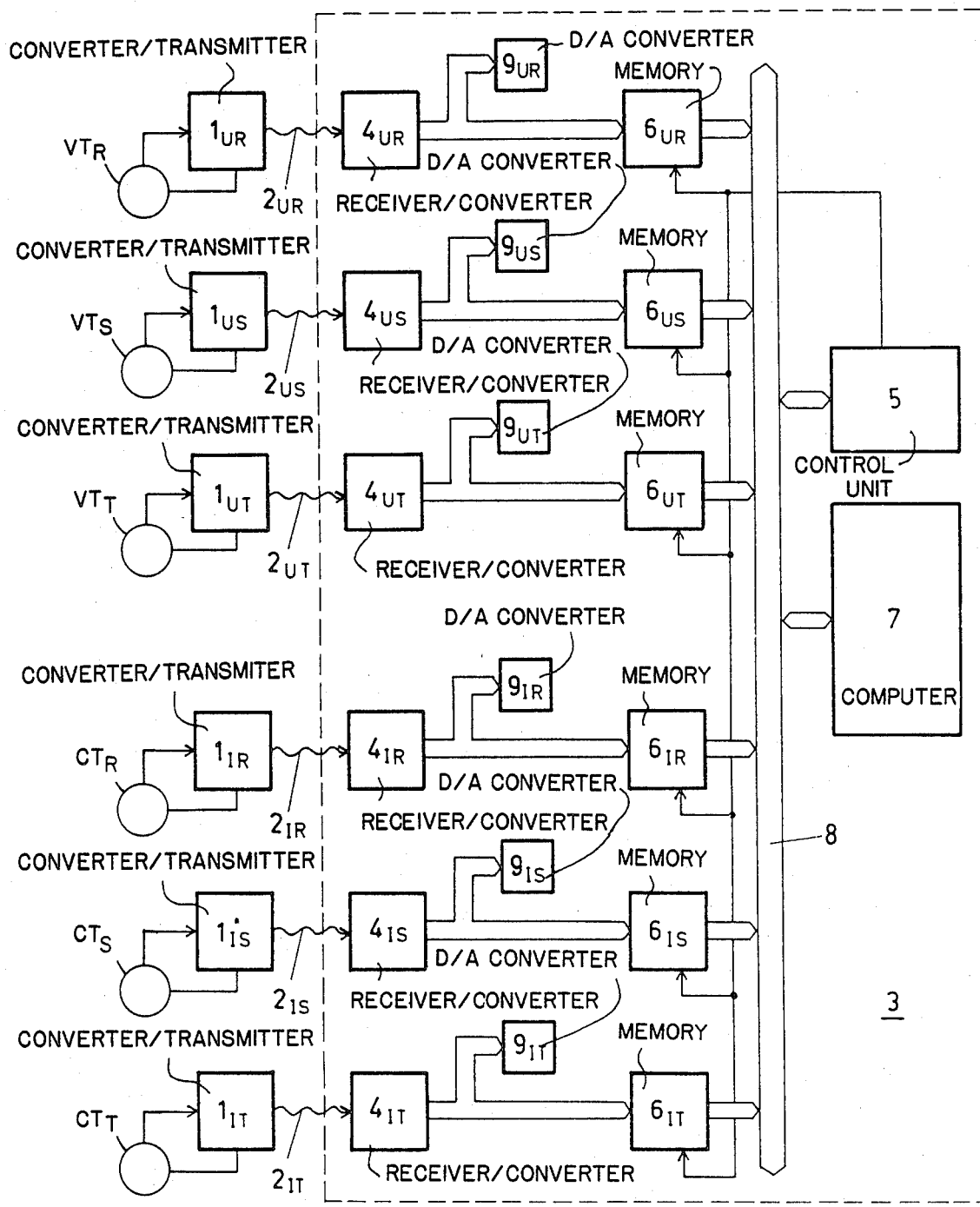
FIG. 1 shows diagrammatically a facility for carrying out the method according to the invention.
Figure 2:
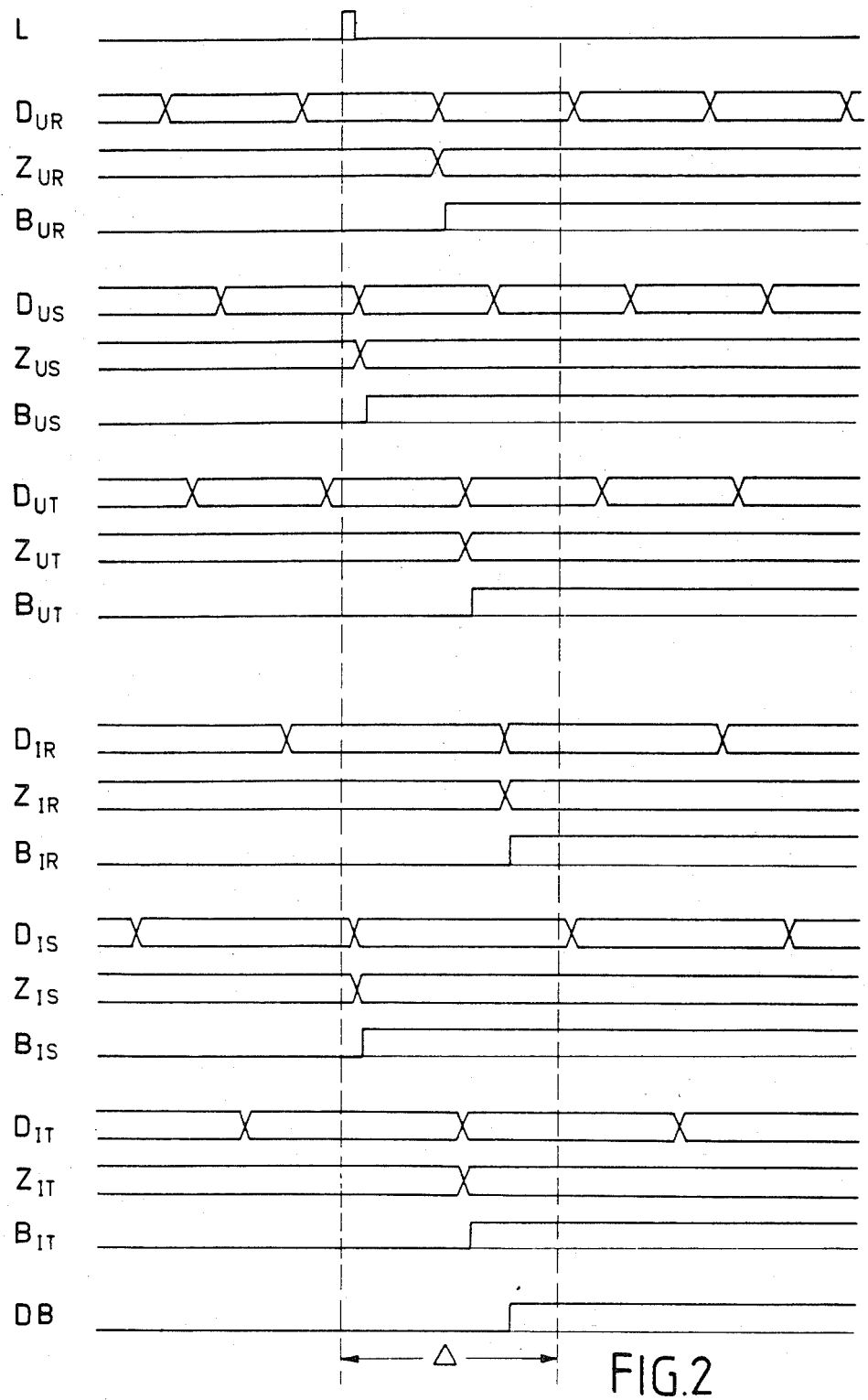
FIG. 2 shows, by way of example, signal variations and data streams in the facility of FIG. 1.

The Figures illustrate a method in which, fundamentally, the analog output signal of a decentralized current transducer $CT_R$, $CT_S$, $CT_T$ or voltage transducer $VT_R$, $VT_S$, $VT_T$ is fed to an also decentralized converter/transmitter $1_{UR}$, $1_{US}$, $1_{UT}$, $1_{IR}$, $1_{IS}$, $1_{IT}$ and is there sampled by means of a fast A/D converter in accordance with a timing pattern, which is generated by a clock generator contained in the converter/transmitter $1_{UR}$, ... and is directly converted into a serial data stream $D_{UR}$, $D_{US}$, $D_{UT}$, $D_{IR}$, $D_{IS}$, $D_{IT}$, which consists of successive digitized sampled values. Converted into light pulses, the data stream $D_{UR}$, ... passes by a unidirectional data line $2_{UR}$, which is implemented by means of a fibre-optical waveguide, to a central evaluating facility 3 where it is converted in a receiver/converter $4_{UR}$, ... into electric signals and subsequently into parallel digital data.

According to the invention, a latch command L is generated via a control unit 5 in the central evaluating facility 3 at intervals which depend on internal and external parameters but which are not smaller than the maximum $\Delta$ of the data-refresh intervals of the data-refresh patterns generated in the converter/trasnmitters $1_{UR}$, ... This latch command causes the digitized sampled value, arriving next in each case in the central evaluating facility 3, of each of the data streams $D_{UR}$, ..., to be temporarily stored in a temporary memory $6_{UR}$, ... The data $Z_{UR}$, ... stored in the temporary memories $6_{UR}$, ..., therefore consist at each time of digitized sampled values which have arrived in the central evaluating facility at times which are spaced apart by less than the maximum $\Delta$ of the data refresh intervals of the timing patterns generated in the decentralized coding units $1_{UR}$, ...; that is to say which, apart from any differences in transmit time which, however, are generally insignificant or can be compensated, the data are based on samplings which are spaced apart by less than the said maximum $\Delta$ of the data-refresh intervals. Directly after a new digitized sampled value has been stored in one of the temporary memories $6_{UR}$, ..., in each case a "Ready" signal $B_{UR}$, ... is generated. The "Ready" signals $B_{UR}$, ... are fed, singly or combined in a logical AND operation to form a "Data set ready" signal, to a computer 7. As soon as the "Data set ready" signal DB is set, the computer 7 can sequentially interrogate the digital sampled values stored in the temporary memories $6_{UR}$, ... via a databus 8. This provides particularly rapid access to the said sampled values.

In parallel with the temporary memories $6_{UR}$, ..., D/A converters $9_{UR}$, ... may be connected to the data lines coming from the receiver/receiver/converters. These D/A converters reconvert the digital data into analog signals corresponding to the analog output signals of the converters and which can be followed by older analog devices.

In the example shown, the analog output signals originate from three voltage transducers and three current transducers which monitor a three-phase line. The sampling rates are, for example, once in 5 $\mu$sec for the current transducers and a little less than once in 3 $\mu$sec for the voltage transducers. This leads to an upper limit for the time difference between samplings, on which data units jointly to be processed further are based, of 5 $\mu$sec which meets also the most stringent requirements. The sampling rates specified can be achieved with commercially available components, for example the 12-bit A/D converter AD 578 by Analog Devices. However, much lower values are adequate for many purposes.

We claim:

1. A method for processing, in a central evaluating facility, analog output signals from a plurality of decentralized transducers, comprising the steps of:

generating a timing pattern at a decentralized location corresponding to the decentralized transducers in accordance with data-refresh intervals;

sampling an analog output of each decentralized transducer in accordance with said timing pattern to obtain a sampled value;

transmitting said sampled value of said analog output of each decentralized transducer directly to said central evaluating facility in the form of a data stream of successive digitized sampled values; and producing data sets at the central evaluating facility which contain one digitized sampled value from each data stream, said data sets being produced by the substeps of:

generating latch commands at the central evaluating facility at intervals that are at least as great as the maximum data-refresh interval; and acquiring, after each latch command, the digitized sampled value of each data stream that is present, or if not present, the next arriving sampled value of each data stream.

2. Method according to claim 1, wherein the maximum data-refresh interval of the timing pattern generated at the decentralized location is less than 2000 $\mu$sec and preferably less than 5 $\mu$sec.

3. A method according to claim 1 and further comprising, after each acquisition of a digitized sampled value from a data stream, the steps of setting a READY signal for each digitized sampled value which is acquired following a latch command and generating a DATA SET READY signal by performing a logical AND operation on said READY signals once a data set has been generated.

4. An apparatus according to claim 3, wherein the central evaluating facility further includes a databus which is connected to the computer and to the temporary memories.

5. An apparatus according to claim 4, wherein the central evaluating facility further includes at least one D/A converter operatively connected with said receiver/converter for converting said parallel digital data into an analog signal.

6. An apparatus for processing a plurality of analog output signals, comprising:

a plurality of decentralized converter/transmitters, a central evaluating facility, each of said converter/transmitters having a corresponding potential-isolating data line connected with said central evaluating facility;

each of said decentralized converter/transmitters including means for generating data-refresh intervals and an A/D converter for sampling one of said analog output signals during each data-refresh interval and converting said sampled analog output signal into a serial data stream of successive sampled values for transmission over the corresponding one of said data line to said central unit, each of said data-refresh interval generating means operating independently with respect to said central evaluating facility;

said central evaluating facility including a receiver/converter for each converter/transmitter for converting each serial data stream into parallel digital data, a temporary memory operatively connected to each receiver/converter for temporarily storing said parallel digital data, a control unit for generating latch commands at intervals at least as great as the maximum data-refresh interval, said latch command causing each of said temporary memories to store the next successive sampled value from the respective receiver/converter, and a computer for interrogating the digital sampled values stored in the temporary memories.

7. The method of claim 1, wherein said latch commands are generated at intervals that are greater than the maximum data-refresh interval.

8. The apparatus of claim 6, wherein said latch commands are generated at intervals that are greater than the maximum data-refresh interval.

* * * * *